(12) United States Patent
Zhou et al.

(10) Patent No.: US 11,569,275 B2
(45) Date of Patent: Jan. 31, 2023

(54) ARRAY SUBSTRATE, METHOD FOR PREPARING THE SAME, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Guoqing Zhou, Beijing (CN); Chao Wang, Beijing (CN); Shengwei Zhao, Beijing (CN); Jingping Lv, Beijing (CN); Lin Xie, Beijing (CN); Zhiqiang Chang, Beijing (CN)

(73) Assignees: ORDOS YUANSHENG OPTOELECTRONICS CO., LTD., Ordos (CN); BOE TECHNOLOGY GROUP CO., LTD., Beijing (CN)

(*) Notice: Subject to any disclaimer, the term of this patent is extended or adjusted under 35 U.S.C. 154(b) by 172 days.

(21) Appl. No.: 16/957,354

(22) PCT Filed: Feb. 13, 2020

(86) PCT No.: PCT/CN2020/075033
§ 371 (c)(1),
(2) Date: Jun. 23, 2020

(87) PCT Pub. No.: WO2020/181948
PCT Pub. Date: Sep. 17, 2020

(65) Prior Publication Data
US 2021/0375956 A1 Dec. 2, 2021

(30) Foreign Application Priority Data
Mar. 11, 2019 (CN) .......................... 201910180171.X

(51) Int. Cl.
*H01L 27/12* (2006.01)

(52) U.S. Cl.
CPC ........ *H01L 27/1288* (2013.01); *H01L 27/124* (2013.01)

(58) Field of Classification Search
CPC .......................... H01L 27/124; H01L 27/1288
See application file for complete search history.

(56) References Cited

U.S. PATENT DOCUMENTS

| 2002/0080317 A1 | 6/2002 | Yeo et al. |
| 2017/0278940 A1 | 9/2017 | Luo et al. |
| (Continued) | | |

FOREIGN PATENT DOCUMENTS

| CN | 1360296 A | 7/2002 |
| CN | 105093807 A | 11/2015 |
| (Continued) | | |

OTHER PUBLICATIONS

Second Office Action for Chinese Application No. 201910180171.X, dated Apr. 25, 2021, 7 Pages.

(Continued)

*Primary Examiner* — Trang Q Tran
(74) *Attorney, Agent, or Firm* — Brooks Kushman P.C.

(57) ABSTRACT

The present disclosure provides an array substrate, a method for preparing the same, and a display device. The method includes: forming a metal layer on a base substrate; coating a photoresist on the metal layer; exposing the photoresist by a mask plate in such a manner that an amount of light acting on a first photoresist portion is less than that of light acting on a second photoresist portion to form a first photoresist reserved portion located and a second photoresist reserved portion located; after etching off the metal portion, stripping the first photoresist reserved portion and the second photoresist reserved portion, to obtain the first metal pattern located in the fan-out area and the second metal pattern located in the display area, in which a period size of the first (Continued)

metal pattern being smaller than a period size of the second metal pattern.

9 Claims, 4 Drawing Sheets

(56) References Cited

U.S. PATENT DOCUMENTS

| | | | |
|---|---|---|---|
| 2018/0004080 A1 | 1/2018 | Yu | |
| 2019/0165072 A1* | 5/2019 | Wang | ............... H01L 27/3265 |
| 2019/0189650 A1 | 6/2019 | Gong et al. | |
| 2019/0310528 A1* | 10/2019 | Zhu | ............... H01L 27/1248 |

FOREIGN PATENT DOCUMENTS

| CN | 105206621 A | 12/2015 |
|---|---|---|
| CN | 107068692 A | 8/2017 |
| CN | 107170753 A | 9/2017 |
| CN | 109920801 A | 6/2019 |

OTHER PUBLICATIONS $1^{st}$ Chinese Office Action, English Translation.
International Search Report and Written Opinion, English Translation.
CN105206621A, English Abstract and Machine Translation.
CN107068692A, English Abstract and Machine Translation.
CN107170753A, English Abstract and U.S. Equivalent U.S. Pub. No. 2019/0189650.
CN109920801A, English Abstract and Machine Translation.
First Office Action for Chinese Application No. 201910180171.X, dated Oct. 12, 2020, 6 Pages.
International Search Report and Written Opinion for Application No. PCT/CN2020/075033, dated Apr. 28, 2020, 10 Pages.
$2^{nd}$ Chinese Office Action, English Translation.
CN1360296A, English Abstract and U.S. Equivalent U.S. Pub. No. 2002/0080317.
CN105093807A, English Abstract and U.S. Equivalent U.S. Pub. No. 2017/0278940.

* cited by examiner

ARRAY SUBSTRATE, METHOD FOR PREPARING THE SAME, AND DISPLAY DEVICE

CROSS-REFERENCE TO RELATED APPLICATION APPLICATIONS

This application is the U.S. national phase of PCT Application No. PCT/CN2020/070533 filed on Feb. 13, 2020, which claims priority to Chinese Patent Application No. 201910180171.X filed on Mar. 11, 2019, which are incorporated herein by reference in their entireties.

TECHNICAL FIELD

The present disclosure relates to the field of display technology, in particular to an array substrate, a method for preparing the same, and a display device.

BACKGROUND

The frame area of the display device is provided with a fan-out area. However, the current fan-out area has a larger area due to a larger gate pitch.

SUMMARY

In an aspect, the present disclosure provides a method for preparing an array substrate, including:

forming a metal layer on a base substrate;

coating a photoresist on the metal layer;

exposing the photoresist by a mask plate in such a manner that an amount of light acting on a first photoresist portion is less than an amount of light acting on a second photoresist portion to form a first photoresist reserved portion located in a fan-out area and a second photoresist reserved portion located in the display area, in which a width of the first photoresist reserved portion is less than a width of the second photoresist reserved portion, the first photoresist portion is located in the fan-out area, and the second photoresist portion is located in the display area;

etching off a metal portion of the metal layer corresponding to a photoresist removal portion; and stripping the first photoresist reserved portion and the second photoresist reserved portion, to obtain a first metal pattern located in the fan-out area and a second metal pattern located in the display area, in which a period size of the first metal pattern is smaller than a period size of the second metal pattern, and the photoresist removal portion is a portion of the photoresist other than the first photoresist reserved portion and the second photoresist reserved portion.

Optionally, the forming the metal layer on the base substrate includes:

forming a first metal layer on the base substrate of the fan-out area;

forming an original poly-silicon structure layer on the base substrate of the display area, and forming a second metal layer on the original poly-silicon structure layer.

Optionally, the method further includes implanting $P^+$ ions into a poly-silicon structure of the original poly-silicon structure layer located in a first conversion region, to convert it into a source-drain doped poly-silicon structure, in which an orthogonal projection of the first conversion region on the base substrate does not coincide with an orthogonal projection of the second photoresist reserved portion on the base substrate.

Optionally, the method further includes implanting $P^+$ ions into a poly-silicon structure of the original poly-silicon structure layer located in a second conversion region, to convert it into a drain lightly doped poly-silicon structure, in which an orthogonal projection of the second conversion region on the base substrate is located between the orthogonal projection of the first conversion region on the base substrate and the orthogonal projection of the second photoresist reserved portion on the base substrate.

Optionally, the exposing the photoresist by the mask plate in such a manner that the amount of light acting on the first photoresist portion is less than the amount of light acting on the second photoresist portion to form the first photoresist reserved portion located in the fan-out area and the second photoresist reserved portion located in the display area includes:

exposing the first photoresist portion by a first mask plate to form the first photoresist reserved portion located in the fan-out area; and exposing the second photoresist portion by a second mask plate to form the second photoresist reserved portion located in the display area, in which an exposure amount for exposing the first photoresist portion is less than an exposure amount for exposing the second photoresist portion.

Optionally, the exposing the first photoresist portion by the first mask plate to form the first photoresist reserved portion located in the fan-out area includes:

exposing the photoresist by a first mask plate, in which the first mask plate comprises a first opaque pattern corresponding to the display area and a second opaque pattern corresponding to the first photoresist reserved portion; and forming the first photoresist reserved portion located in the fan-out area and the photoresist located in the display area after development.

Optionally, the exposing the second photoresist portion by the second mask plate to form the second photoresist reserved portion located in the display area includes:

exposing the photoresist by a second mask plate, in which the second mask plate comprises a third opaque pattern corresponding to the fan-out area and a fourth opaque pattern corresponding to the second photoresist reserved portion; and forming the second photoresist reserved portion located in the display area and the photoresist located in the fan-out area after development.

Optionally, the exposing the photoresist by the mask plate in such a manner that the amount of light acting on the first photoresist portion is less than the amount of light acting on the second photoresist portion to form the first photoresist reserved portion located in the fan-out area and the second photoresist reserved portion located in the display area includes:

exposing the photoresist on the metal layer by a gray tone mask plate, in which the gray tone mask plate comprises opaque patterns located in the fan-out area and in the display area, a partially transparent pattern located in the fan-out area and outside the opaque patterns, and a transparent pattern located in the display area and outside the opaque pattern; and after development, forming a photoresist removal portion corresponding to a region of the display area other than the second photoresist reserved portion, a photoresist partially reserved portion corresponding to a region of the fan-out area other than the first photoresist reserved portion, a first photoresist reserved portion corresponding to the first photoresist reserved portion in the fan-out area, and a second photoresist reserved portion corresponding to the second photoresist reserved portion.

Optionally, the coating photoresist on the metal layer includes coating a photoresist on the metal layer, in which a thickness of the photoresist corresponding to the first photoresist reserved portion is greater than a thickness of the photoresist in other portions.

Optionally, the etching off the metal portion of the metal layer corresponding to the photoresist removal portion includes: etching off the metal layer corresponding to the photoresist removal portion; and ashing the photoresist partially reserved portion, and etching off the metal layer corresponding to the photoresist partially reserved portion.

In another aspect, the present disclosure also provides an array substrate prepared by any one of the methods for preparing the array substrate as described above.

In still another aspect, the present disclosure also provides an array substrate, including a first metal pattern located in a fan-out area and a second metal pattern located in a display area, in which a period size of the first metal pattern is smaller than 80% of a period size of the second metal pattern.

Optionally, the period size of the first metal pattern is a sum of a width of one gate line in the fan-out area and a pitch between adjacent gate lines; and the period size of the second metal pattern is a sum of a width of one gate line in the display area and a pitch between adjacent gate lines.

Optionally, the array substrate further includes:
a base substrate;
an original poly-silicon structure layer arranged between the base substrate of the display area and the second metal pattern;
a source-drain doped poly-silicon structure arranged on both sides of the original poly-silicon structure layer; and
a drain lightly doped poly-silicon structure arranged between the poly-silicon structure layer and the source-drain doped poly-silicon structure.

In yet another aspect, the present disclosure also provides a display device including any one of the array substrates as described above.

In the technical solution provided by the present disclosure, the mask plate is used to expose the photoresist in such a manner that the amount of light acting on the first photoresist portion in the fan-out area is less than the amount of light acting on the second photoresist portion in the display area. In this way, it can avoid the occurrence of breakage of the first metal pattern with a smaller width during the exposure adjustment process for the second metal pattern of the display area, so that the period size of the first metal pattern in the fan-out area can be made smaller, thereby facilitating the development of the narrow frame of the display device. Therefore, the technical solution provided by the present disclosure can facilitate the development of the narrow frame of the display device.

BRIEF DESCRIPTION OF THE DRAWINGS

In order to illustrate the technical solutions of the present disclosure in a clearer manner, the drawings desired for the embodiments of the present disclosure will be given a brief introduction hereinafter. Obviously, the following drawings merely relate to some embodiments of the present disclosure. Based on these drawings, a person skilled in the art may obtain the other drawings without any creative effort.

DETAILED DESCRIPTION

The technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on these embodiments, a person skilled in the art may, without any creative effort, obtain the other embodiments, which also fall within the scope of the present disclosure.

In the related art, in order to satisfy the exposure accuracy of the display (AA) area and the fan-out area at the same time, the gate pitch cannot be significantly reduced, thereby leading to a larger frame width of the display device. This is not conducive to the development trend of narrowing the frame of the display device.

Figure 1:
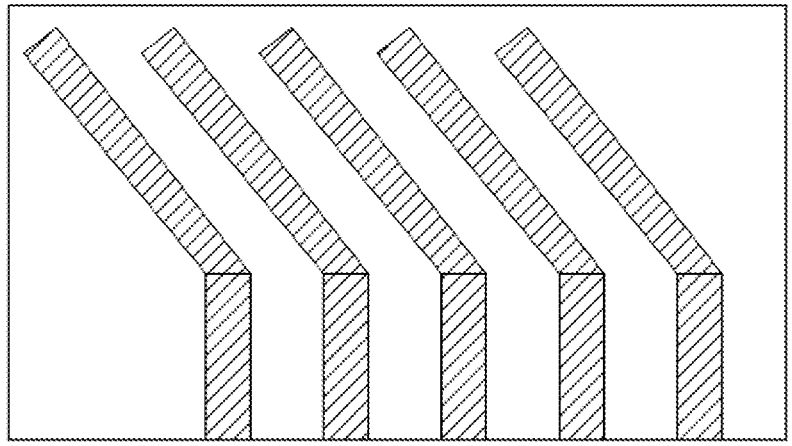
FIG. 1 is a schematic view showing the structure of the gate line in the fan-out area of the display device in the related art.

Taking the production of the gate line as an example, for the development of narrowing the frame, the width of the gate pattern in the fan-out area is smaller than the width of the gate pattern in the display area. That is, after exposure, the width of the first photoresist for forming the gate line in the fan-out area is smaller than the width of the second photoresist for forming the gate line in the display area. The structure of the gate line of the fan-out area in the related art is shown in FIG. 1. However, in the related art, when the photoresist is exposed using the mask plate, the amount of light acting on the photoresist in the fan-out area is equal to the amount of light acting on the photoresist in the display area. In this way, if a larger exposure will not cause the wider first photoresist to break, it may cause the narrower second photoresist to break. The narrower the second photoresist, the higher the probability of breaking. As a result, a gate pattern with a smaller width cannot be formed in the fan-out area. Therefore, the method for preparing the array substrate in the related art cannot produce a gate line pattern with a smaller width in the fan-out area.

In view of the above problems, the embodiments of the present disclosure provide an array substrate, a method for preparing the same, and a display device, which can form a gate line pattern with a smaller width in the fan-out area, thereby facilitating the development of narrowing frame of the display device.

Figure 2:
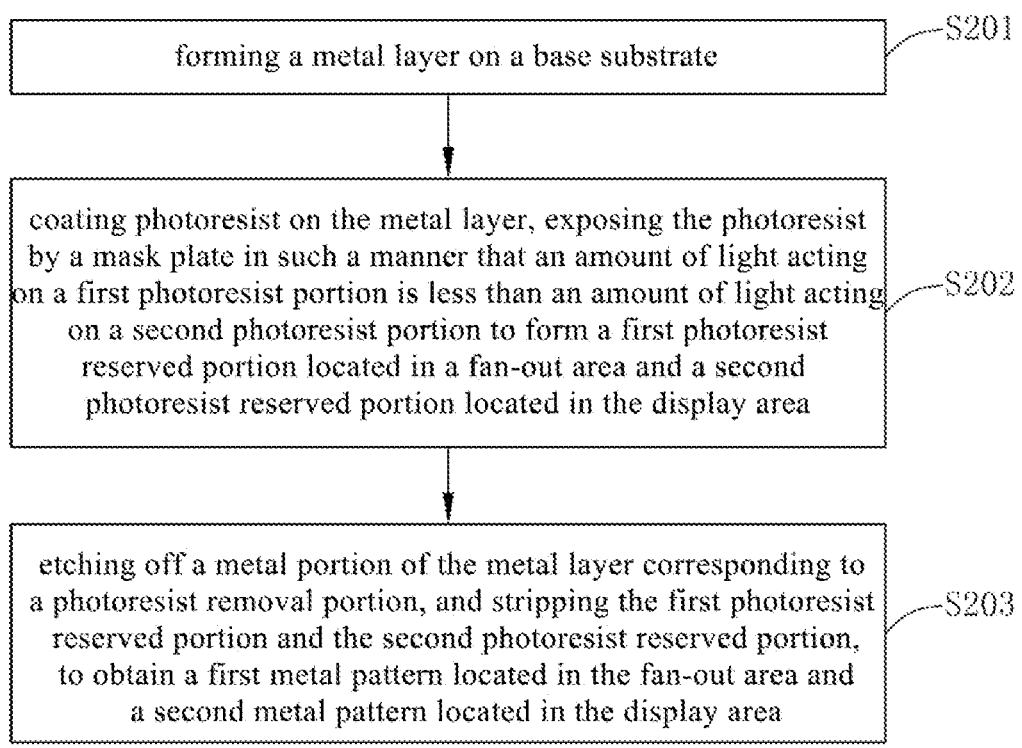
FIG. 2 is a flowchart of the method for preparing the array substrate according to an embodiment of the present disclosure.

Refer to FIG. 2, which is a flowchart of the method for preparing the array substrate according to an embodiment of the present disclosure. The method for preparing the array substrate includes the following steps.

Step 201: forming a metal layer on the base substrate.

Step 202: coating photoresist on the metal layer, exposing the photoresist by a mask plate in such a manner that an amount of light acting on a first photoresist portion is less than an amount of light acting on a second photoresist portion to forming a first photoresist reserved portion located in a fan-out area and a second photoresist reserved portion located in the display area, in which a width of the first photoresist reserved portion is less than a width of the second photoresist reserved portion, the first photoresist portion is located in the fan-out area, and the second photoresist portion is located in the display area.

Step 203: after etching off the metal portion corresponding to the photoresist removal portion in the metal layer, stripping the first photoresist reserved portion and the second photoresist reserved portion, to obtain a first metal pattern located in the fan-out area and a second metal pattern located in the display area, in which a period size of the first metal pattern is smaller than a period size of the second metal pattern, and the photoresist removal portion is a portion of the photoresist other than the first photoresist reserved portion and the second photoresist reserved portion.

In the embodiment of the present disclosure, the mask plate is used to expose the photoresist in such a manner that the amount of light acting on the first photoresist portion in the fan-out area is less than the amount of light acting on the second photoresist portion in the display area. In this way, it can avoid the occurrence of breakage of the first metal pattern with a smaller width during the exposure adjustment process for the second metal pattern of the display area, so that the period size of the first metal pattern in the fan-out area can be made smaller, thereby facilitating the development of the narrow frame of the display device. Therefore, the technical solution provided by the present disclosure can facilitate the development of the narrow frame of the display device.

The above base substrate may be a flexible substrate, such as a polyimide film; or may be a rigid base substrate, such as a quartz substrate or a glass substrate.

The metal layer may be formed on the base substrate by means of deposition, specifically using physical deposition or chemical deposition, which is not limited in the embodiments of the present disclosure. The metal layer covers the fan-out area and the display area of the base substrate.

In the exposure, the amount of light acting on the first photoresist portion is different from the amount of light acting on the second photoresist portion. That is, the first photoresist portion and the second photoresist portion receive different amounts of exposure in the exposure process. Optionally, the first photoresist portion and the second photoresist portion may be exposed separately, and regarding the situation that the amount of exposure received by first photoresist portion is different from the amount of exposure received by second photoresist portion, a special mask plate need to be used during each exposure and a total of two mask plates are used. Optionally, to make the amount of exposure received by first photoresist portion different from the amount of exposure received by second photoresist portion, a part of the amount of light to be received by first photoresist portion may be blocked in the exposure process, and only a special mask plated is needed.

Figure 3:
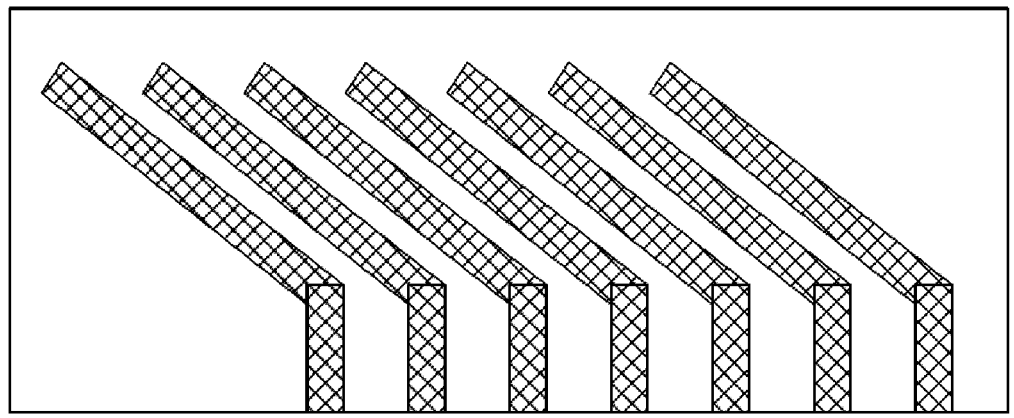
FIG. 3 is a schematic view showing the period size of the gate line according to an embodiment of the present disclosure.

Therefore, in the case where a larger amount of light is used to expose the second photoresist portion of the display area, only a smaller amount of light is used to expose the first photoresist portion of the fan-out area, which does not cause the first metal pattern partially covered by the first photoresist with a narrow width to break, thereby being capable of preparing a metal pattern with a small period size. The gate line structure prepared by the embodiment of the present disclosure is shown in FIG. 3.

Figure 4:
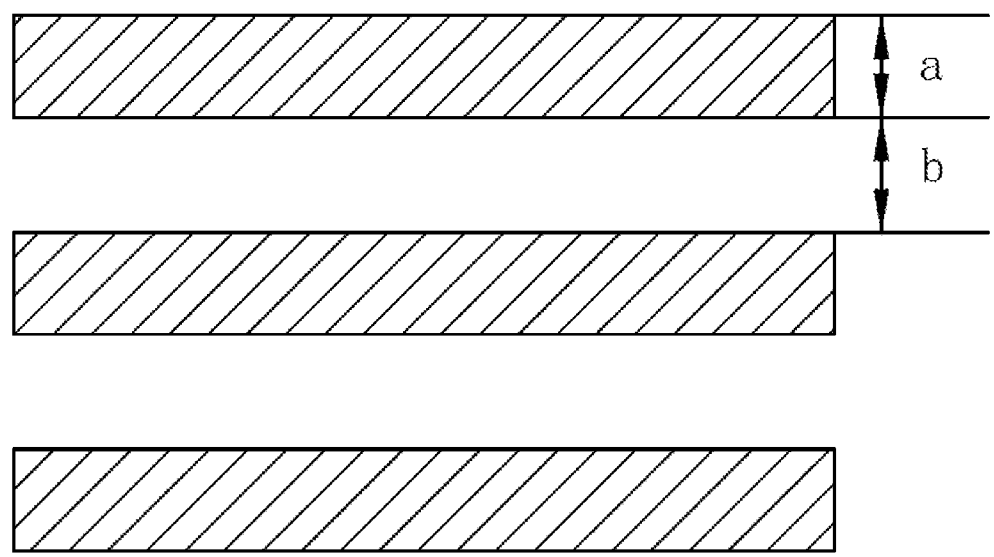
FIG. 4 is a schematic view showing the structure of the gate line in the fan-out area prepared by the method for preparing the array substrate according to an embodiment of the present disclosure.

It should be noted that taking the gate line as an example, as shown in FIG. 4, the period size of the first metal pattern is a sum of a width a of one gate line in the fan-out area and a pitch b between adjacent gate lines; and the period size of the second metal pattern is a sum of a width of one gate line in the display area and a pitch between adjacent gate lines.

The etching the metal portion of the metal layer corresponding to the photoresist removal portion may be performed by a wet etching process or a dry etching process, which is not limited herein.

In some optional embodiments, the mask exposing the photoresist by the mask plate in such a manner that the amount of light acting on the first photoresist portion is less than the amount of light acting on the second photoresist portion to form the first photoresist reserved portion located in the fan-out area and the second photoresist reserved portion located in the display area includes: exposing the first photoresist portion by a first mask plate to form the first photoresist reserved portion located in the fan-out area; and exposing the second photoresist portion by a second mask plate to form the second photoresist reserved portion located in the display area, in which an exposure amount for exposing the first photoresist portion is less than an exposure amount for exposing the second photoresist portion.

In this embodiment, the first photoresist reserved portion and the second photoresist reserved portion are formed by exposures twice, respectively. The first photoresist reserved portion may be formed before the second photoresist reserved portion is formed. Alternatively, the second photoresist reserved portion may be formed before the first photoresist reserved portion is formed.

In an optional embodiment, the exposing the first photoresist portion by the first mask plate to form the first photoresist reserved portion located in the fan-out area includes exposing the photoresist by a first mask plate, in which the first mask plate comprises a first opaque pattern corresponding to the display area and a second opaque pattern corresponding to the first photoresist reserved portion; and forming the first photoresist reserved portion located in the fan-out area and the photoresist located in the display area after development.

In this embodiment, the first mask plate covers both the fan-out area and the display area, in which the first opaque pattern corresponds to the first photoresist reserved portion of the fan-out area, and the second opaque pattern corresponds to the entire display area. When the first mask plate is used to expose the photoresist, regardless whether the second photoresist reserved portion has been formed in the display area, it can ensure that the photoresist in the display area is not affected by the exposure. Therefore, without changing the photoresist in the display area, the first photoresist reserved portion is formed in the fan-out area.

In another optional embodiment, the exposing the second photoresist portion by the second mask plate to form the second photoresist reserved portion located in the display area includes: exposing the photoresist by a second mask plate, in which the second mask plate comprises a third opaque pattern corresponding to the fan-out area and a fourth opaque pattern corresponding to the second photoresist reserved portion; and forming the second photoresist reserved portion located in the display area and the photoresist located in the fan-out area after development.

In this embodiment, the second mask plate covers both the fan-out area and the display area, in which the third opaque pattern corresponds to all fan-out areas, and the fourth opaque pattern corresponds to the second photoresist reserved portion in the display area. When the second mask is used to expose the photoresist, regardless whether the first photoresist reserved portion has been formed in the fan-out area, it can ensure that the photoresist in the display area is not affected by the exposure. Therefore, without changing the photoresist in the fan-out area, the second photoresist reserved portion is formed in the display area.

Taking a low temperature poly-silicon (LTPS) display device having the advantages of high speed response, high resolution, thinner and higher aperture ratio, etc. as an example of the display device, in the process for preparing the LTPS display device, it is necessary to use exciter laser light to convert amorphous silicon a-Si to polycrystalline silicon structure P—Si at a temperature of about 400° C. The arrangement of silicon crystals in P—Si is more ordered than that of a-Si, which makes the electron mobility increase by more than 100 times. Subsequently, $P^+$ ions are implanted into the two poly-silicon structures P—Si twice, to obtain the source-drain doped poly-silicon structure P—Si and the drain lightly doped poly-silicon structure P—Si. Specifically, the conversion process of poly-silicon structure P—Si into source-drain doped poly-silicon structure P—Si and drain lightly doped poly-silicon structure P—Si and the process for forming the gate line are together illustrated as below.

Figure 5:
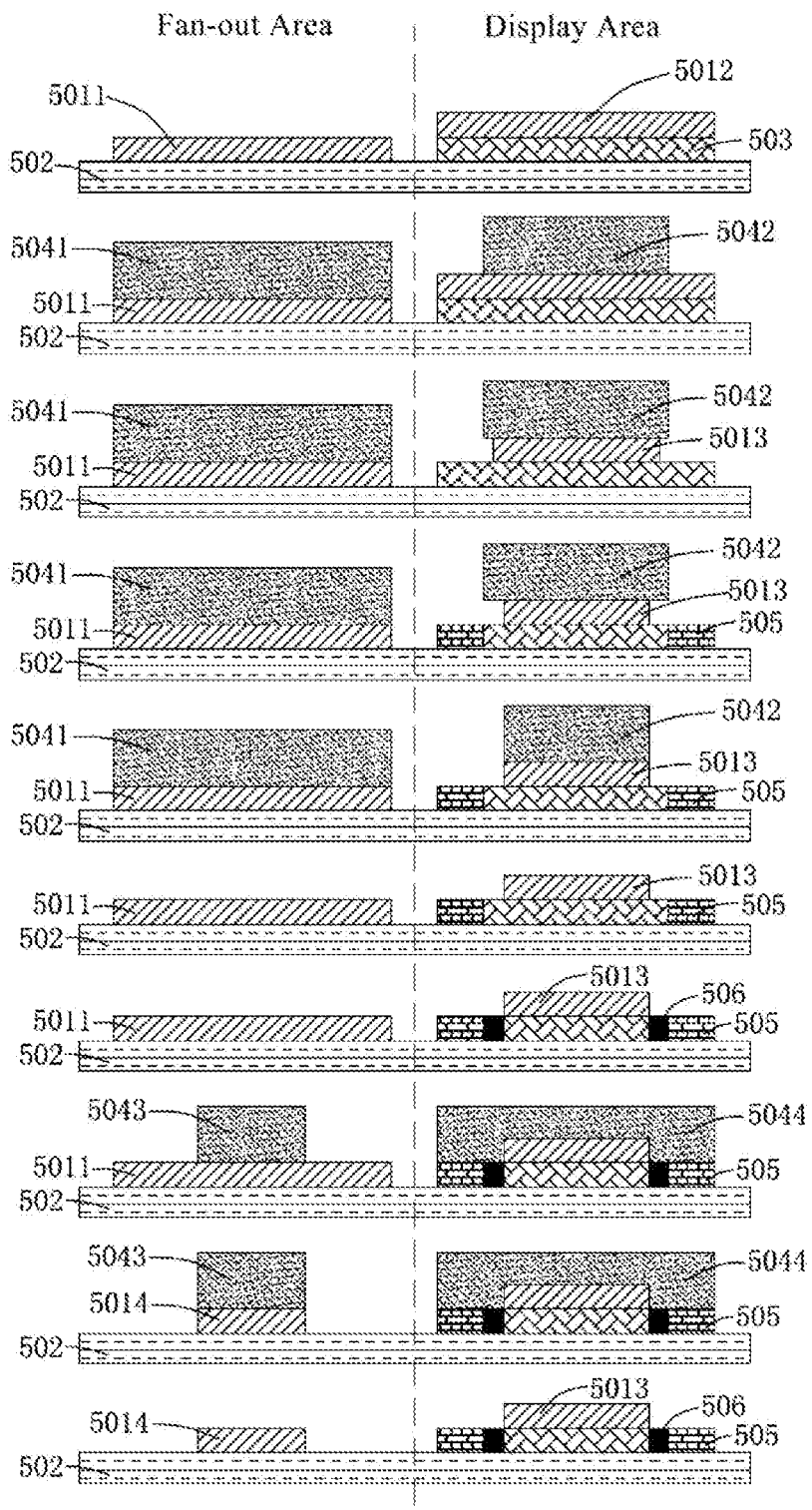
FIG. 5 is a schematic view showing the change of the film layer in the method for preparing the array substrate according to another embodiment of the present disclosure.

As shown in FIG. 5, after the metal layer is formed, the metal layer 5011 in the fan-out area covers the base substrate 502, and the metal layer 5012 in the display area covers the original poly-silicon structure layer 503 on the base substrate 502. Then, the metal layer 5011 in the fan-out area is completely coated with photoresist 5041, the pattern area on the metal layer 5012 in the display area is coated by the photoresist 5042, and an exposure having a larger amount of exposure is performed by the second mask plate. After that, the exposed metal portion in the display area is etched, so that the width of the remaining second metal pattern 5013 is smaller than the width of the photoresist 5042. Then, $P^+$ ions are implanted into the poly-silicon structure P—Si of the original poly-silicon structure layer 503 located in the first conversion region, so as to convert it into a source-drain doped poly-silicon structure P—Si 505. An orthogonal projection of the first conversion area on the base substrate 502 does not coincide with an orthogonal projection of the photoresist 5042 on the base substrate 502 in the display area. Afterwards, a part of the photoresist 5042 in the display area is etched so that the width of the photoresist 5042 in the display area is consistent with the width of the remaining metal pattern 5013, followed by stripping the photoresist 5041 in the fan-out area and the photoresist 5042 in the display area. Then, $P^+$ ions are implanted into the polysilicon structure P—Si of the original poly-silicon structure layer 503 located in the second conversion region, to convert it into a drain lightly doped poly-silicon structure 506. An orthogonal projection of the second conversion region on the base substrate 502 is located between the orthogonal projection of the first conversion area on the base substrate 502 and the orthogonal projection of the photoresist 5042 in the display area on the base substrate 502. Thereafter, the pattern area of the metal layer 5011 in the fan-out area is coated with a photoresist 5043, the display area is completely coated with a photoresist 5044, and an exposure having a smaller amount of exposure is performed by the first mask plate. After that, the exposed metal portion in the fan-out area is etched off to retain the first metal pattern 5014. Finally, the photoresist 5043 of the display area and the photoresist 5044 of the fan-out area are stripped, to obtain the first metal pattern 5014 in the fan-out area, the second metal pattern 5013 in the display area, and the source-drain doped poly-silicon structure P—Si 505 and the drain lightly doped poly-silicon structure P—Si 506.

In this embodiment, the metal layer is exposed twice, in which the amount of exposure for the first photoresist portion is smaller than the amount of exposure for the second photoresist portion, so that it can form the first photoresist reserved portion having a width narrower than that in the related art. This embodiment is conducive to form a first metal pattern having a narrower width, and to facilitate the development of a narrow frame of the display device.

In another optional embodiment, the exposing the photoresist by the mask plate in such a manner that the amount of light acting on the first photoresist portion is less than the amount of light acting on the second photoresist portion to form the first photoresist reserved portion located in the fan-out area and the second photoresist reserved portion located in the display area includes: exposing the photoresist on the metal layer by a gray tone mask plate, the gray tone mask plate comprising an opaque pattern located in the fan-out area and the display area, a partially transparent pattern located in the fan-out area and outside the opaque pattern, and a transparent pattern located in the display area and outside the opaque pattern; and after development, forming a photoresist removal portion corresponding to a region of the display area other than the second photoresist reserved portion, a photoresist partially reserved portion corresponding to a region of the fan-out area other than the first photoresist reserved portion, a first photoresist reserved portion corresponding to the first photoresist reserved portion in the fan-out area, and a second photoresist reserved portion corresponding to the second photoresist reserved portion in the display area.

In this embodiment, with only one exposure, the light transmittance characteristics can be adjusted by the gray tone mask plate in the exposure process in such a manner that the amount of light acting on the first photoresist portion is less than the amount of light acting on the second photoresist portion, further forming a first photoresist reserved portion and a second photoresist reserved portion.

The gray-tone mask plate covers both the fan-out area and the display area in the exposure process, in which the opaque pattern corresponds to the first photoresist reserved portion of the fan-out area and the second photoresist reserved portion of the display area, the partially transparent pattern corresponds to the region of the fan-out area other than the first photoresist reserved portion, and the transparent pattern corresponds to the region of the display area other than the second photoresist reserved portion.

The partially transparent pattern can block a part of the amount of light originally acting on the photoresist in the region of the fan-out area other than the first photoresist reserved portion, thereby avoiding the exposure of the metal covered by the first photoresist reserved portion to a larger amount of light, and avoiding the subsequently obtained first metal pattern to break.

After development, a first photoresist reserved portion corresponding to the opaque pattern and a photoresist partially reserved portion corresponding to the partially transparent pattern are formed on the metal layer of the fan-out area; and a second photoresist reserved portion corresponding to the opaque pattern and a photoresist removal portion corresponding to the transparent pattern are formed on the metal layer of the display area.

Also taking the display device as an LTPS display device as an example, the conversion process of the original poly-silicon structure P—Si into source-drain doped poly-silicon structure P—Si and drain lightly doped poly-silicon structure P—Si and the process for forming the gate line are together illustrated as below.

Figure 6:
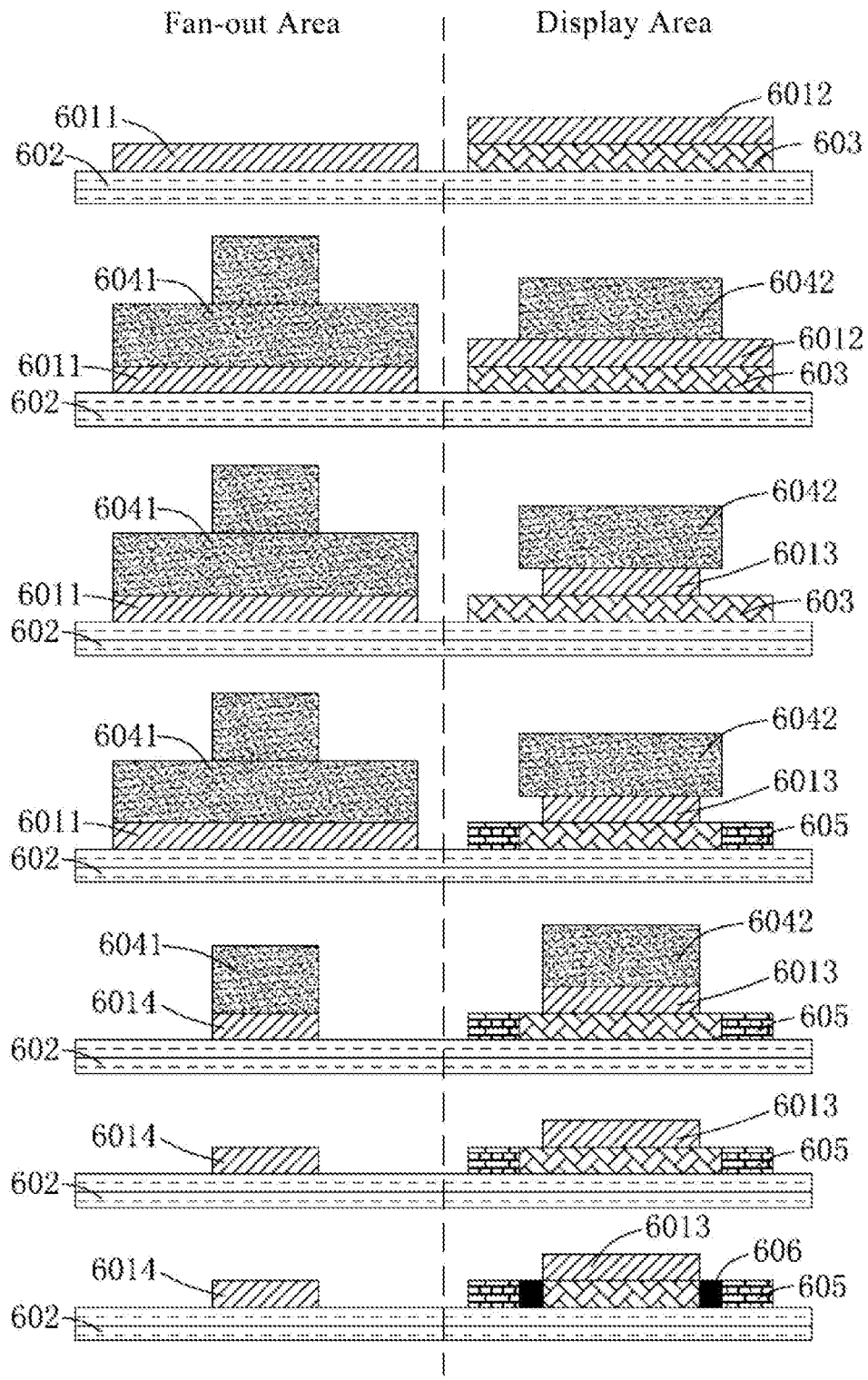
FIG. 6 is a schematic view showing the change of the film layer in the method for preparing the array substrate according to a yet embodiment of the present disclosure.

As shown in FIG. 6, after the metal layer is formed, the metal layer 6011 in the fan-out area covers the base substrate 602, and the metal layer 6012 in the display area covers the original poly-silicon structure layer 603 on the base substrate. Then, the metal layer in the fan-out area is completely coated with a photoresist 6041, the pattern area on the metal layer of the display area is coated with a photoresist 6042, and a exposure having a larger amount of exposure is performed by a gray-tone mask plate, in which the gray-tone mask plate will block the amount of light received by the photoresist 6041 in the fan-out area in the exposure process. After that, the exposed metal portion in the display area is etched off, and the width of the remaining second metal pattern 6013 is smaller than the width of the photoresist. Then, $P^+$ ions are implanted into the original poly-silicon structure layer 603 of the poly-silicon structure P—Si located in the first conversion region, so as to convert it into a source-drain doped poly-silicon structure P—Si 605, in which an orthogonal projection of the first conversion region on the base substrate 602 does not coincide with an orthogonal projection of the photoresist 6042 in the display area on the base substrate. Afterwards, the metal portion and the photoresist of the non-pattern area in the fan-out area are etched off, to retain only the metal layer and the photoresist in the pattern area. Finally, the photoresist in the fan-out area and the display area is stripping, to retain the first metal pattern 6014 and the photoresist thereon, and $P^+$ ions are implanted into the poly-silicon structure P—Si of the original poly-silicon structure layer 603 located in the second conversion region (an orthogonal projection of the second conversion region on the base substrate is located between the orthogonal projection of the first conversion area on the base substrate and the orthogonal projection of the photoresist in the display area on the base substrate), to convert it into a drain lightly doped poly-silicon structure P—Si 606, thereby obtaining the first metal pattern 6014 located in the fan-out area, the second metal pattern 6013 located in the display area, and the source-drain doped poly-silicon structure P—Si 605 and the drain lightly doped poly-silicon structure P—Si 606.

In this embodiment, the characteristics of the gray tone mask plate in adjusting the light transmittance is capable of forming a first photoresist reserved portion and a second photoresist reserved portion in a single exposure process. This can improve the production efficiency of the display substrate and at the same time achieve a smaller width of the first metal pattern.

Further, the coating photoresist on the metal layer includes coating a photoresist on the metal layer, in which a thickness of the photoresist corresponding to the first metal pattern is greater than a thickness of the photoresist in other portions.

During the exposure, the fan-out area is coated by photoresist, in which a thickness of the photoresist corresponding to the first metal pattern is greater than a thickness of the photoresist in other portions. The thickness of the photoresist corresponding to the first metal pattern is greater than the thickness of the photoresist in other areas, so that the first metal pattern area has small amount of exposure, so that the first metal pattern and the part of the photoresist thereon are retained.

Further, the etching the metal portion of the metal layer corresponding to the photoresist removal portion includes: etching off the metal layer corresponding to the photoresist removal portion; and ashing the photoresist partially reserved portion, and etching off the metal layer corresponding to the photoresist partially reserved portion.

In this embodiment, a part of the photoresist is still remained in the photoresist partially reserved portion, and the remaining photoresist needs to be ashed before the metal layer in the photoresist partially reserved portion is etched off, so as to ensure the portions other than the first photoresist reserved portion and the second photoresist reserved portion are etched completely.

The present disclosure also provides an array substrate prepared by the method for preparing the array substrate as described above.

The present disclosure also provides an array substrate, the array substrate including a first metal pattern located in a fan-out area and a second metal pattern located in a display area, and a period size of the first metal pattern being smaller than 80% of a period size of the second metal pattern.

The width of the first metal pattern located in the fan-out area produced by the above-mentioned method for preparing array substrate is not affected by the exposure of the second metal pattern, so that a first metal pattern having a smaller width can be prepared by reducing the amount of light received by the first metal pattern.

The present disclosure further provides a display device including the above-mentioned display the array substrate.

The display device may be a displayer, a mobile phone, a tablet computer, a television, a wearable electronic device, a navigation display device, or the like.

Since the structure of the display device body is related technology, in which the structure of the array substrate or display panel has been described in detail in the above embodiment, the specific structure of the display panel is not repeated in this embodiment.

It should be noted that in this article, the terms "comprise", "comprising" or any other variation thereof is intended to cover a non-exclusive inclusion, such that a process, a method, an article, or an device comprising a series of elements comprises not only those elements, but also those not explicitly listed, or comprises the elements inherent to such process, such method, such article, or such device. Without more restrictions, the element defined by the sentence "include a . . . " does not exclude that there are other identical elements in the process, method, article or device that includes the element.

Through the description of the above embodiments, a person skilled in the art can clearly understand that the methods in the above embodiments can be implemented by means of a software and a necessary general hardware platform. Of course, it can also be implemented by hardware, but in many cases the former is a better embodiment. Based on such an understanding, the technical solutions of the present disclosure can be embodied in the form of software products in essence or part of contributions to related technologies, and the computer software products are stored in a storage medium (such as ROM/RAM, magnetic disk, or optical disk), including several instructions used to allow a terminal (which may be a mobile phone, a computer, a server, an air conditioner, or a network device, etc.) to execute the methods described in various embodiments of the present disclosure.

The embodiments of the present disclosure have been described above with reference to the accompanying drawings, but the present disclosure is not limited to the above specific embodiments, and the above specific embodiments are merely illustrative, and not restrictive. Without departing from the scope of the present disclosure and the scope of protection of the claims, a person skilled in the art can made many variations in light of the present disclosure, all of which fall into the protection of the present disclosure.

What is claimed is:

1. A method for preparing an array substrate, comprising:
forming a metal layer on a base substrate;
coating a photoresist on the metal layer;
exposing the photoresist by a mask plate in such a manner that an amount of light acting on a first photoresist portion is less than an amount of light acting on a second photoresist portion to form a first photoresist reserved portion located in a fan-out area and a second photoresist reserved portion located in a display area, wherein a width of the first photoresist reserved portion is less than a width of the second photoresist reserved portion, the first photoresist portion is located in the fan-out area, and the second photoresist portion is located in the display area;
etching off a metal portion of the metal layer corresponding to a photoresist removal portion; and
stripping the first photoresist reserved portion and the second photoresist reserved portion, to obtain a first metal pattern located in the fan-out area and a second metal pattern located in the display area, wherein a period size of the first metal pattern is smaller than 80% of a period size of the second metal pattern, and the photoresist removal portion is a portion of the photoresist other than the first photoresist reserved portion and the second photoresist reserved portion,
wherein the forming the metal layer on the base substrate comprises:
forming a first metal layer on the base substrate of the fan-out area;
forming an original poly-silicon structure layer on the base substrate of the display area;
forming a second metal layer on the original poly-silicon structure layer; and
wherein the method further comprises:
implanting $P^+$ ions into a poly-silicon structure of the original poly-silicon structure layer located in a first conversion region, to convert it into a source-drain doped poly-silicon structure, wherein an orthogonal projection of the first conversion region on the base substrate does not coincide with an orthogonal projection of the second photoresist reserved portion on the base substrate.

2. The method of claim 1, wherein the method further comprises:
implanting $P^+$ ions into a poly-silicon structure of the original poly-silicon structure layer located in a second conversion region, to convert it into a drain lightly doped poly-silicon structure, wherein an orthogonal projection of the second conversion region on the base substrate is located between the orthogonal projection of the first conversion region on the base substrate and the orthogonal projection of the second photoresist reserved portion on the base substrate.

3. The method of claim 1, wherein the exposing the photoresist by the mask plate in such a manner that the amount of light acting on the first photoresist portion is less than the amount of light acting on the second photoresist portion to form the first photoresist reserved portion located in the fan-out area and the second photoresist reserved portion located in the display area comprises:
exposing the first photoresist portion by a first mask plate to form the first photoresist reserved portion located in the fan-out area; and
exposing the second photoresist portion by a second mask plate to form the second photoresist reserved portion located in the display area,
wherein an exposure amount for exposing the first photoresist portion is less than an exposure amount for exposing the second photoresist portion.

4. The method of claim 3, wherein the exposing the first photoresist portion by the first mask plate to form the first photoresist reserved portion located in the fan-out area comprises:
exposing the photoresist by a first mask plate, wherein the first mask plate comprises a first opaque pattern corresponding to the display area and a second opaque pattern corresponding to the first photoresist reserved portion; and
forming the first photoresist reserved portion located in the fan-out area and the photoresist located in the display area after development.

5. The method of claim 3, wherein the exposing the second photoresist portion by the second mask plate to form the second photoresist reserved portion located in the display area comprises:
exposing the photoresist by a second mask plate, wherein the second mask plate comprises a third opaque pattern corresponding to the fan-out area and a fourth opaque pattern corresponding to the second photoresist reserved portion; and
forming the second photoresist reserved portion located in the display area and the photoresist located in the fan-out area after development.

6. The method of claim 1, wherein the exposing the photoresist by the mask plate in such a manner that the amount of light acting on the first photoresist portion is less than the amount of light acting on the second photoresist portion to form the first photoresist reserved portion located in the fan-out area and the second photoresist reserved portion located in the display area comprises:
exposing the photoresist on the metal layer by a gray tone mask plate, wherein the gray tone mask plate comprises opaque patterns located in the fan-out area and in the display area, a partially transparent pattern located in the fan-out area and outside the opaque patterns, and a transparent pattern located in the display area and outside the opaque pattern; and
after development, forming a photoresist removal portion corresponding to a region of the display area other than the second photoresist reserved portion, a photoresist partially reserved portion corresponding to a region of the fan-out area other than the first photoresist reserved portion, a first photoresist reserved portion corresponding to the first photoresist reserved portion in the fan-out area, and a second photoresist reserved portion corresponding to the second photoresist reserved portion in the display area.

7. The method of claim 6, wherein the coating photoresist on the metal layer comprises:
coating a photoresist on the metal layer, wherein a thickness of the photoresist corresponding to the first photoresist reserved portion is greater than a thickness of the photoresist in other portions.

8. The method of claim 6, wherein the etching off the metal portion of the metal layer corresponding to the photoresist removal portion comprises:
- etching off the metal layer corresponding to the photoresist removal portion; and
- ashing the photoresist partially reserved portion, and etching off the metal layer corresponding to the photoresist partially reserved portion.

9. A method for preparing an array substrate, comprising:
- forming a metal layer on a base substrate;
- coating a photoresist on the metal layer;
- exposing the photoresist by a mask plate in such a manner that an amount of light acting on a first photoresist portion is less than an amount of light acting on a second photoresist portion to form a first photoresist reserved portion located in a fan-out area and a second photoresist reserved portion located in a display area, wherein a width of the first photoresist reserved portion is less than a width of the second photoresist reserved portion, the first photoresist portion is located in the fan-out area, and the second photoresist portion is located in the display area;
- etching off a metal portion of the metal layer corresponding to a photoresist removal portion; and
- stripping the first photoresist reserved portion and the second photoresist reserved portion, to obtain a first metal pattern located in the fan-out area and a second metal pattern located in the display area, wherein a period size of the first metal pattern is smaller than 80% of a period size of the second metal pattern, and the photoresist removal portion is a portion of the photoresist other than the first photoresist reserved portion and the second photoresist reserved portion,
- wherein the exposing the photoresist by the mask plate in such a manner that the amount of light acting on the first photoresist portion is less than the amount of light acting on the second photoresist portion to form the first photoresist reserved portion located in the fan-out area and the second photoresist reserved portion located in the display area comprises:
- exposing the photoresist on the metal layer by a gray tone mask plate, wherein the gray tone mask plate comprises opaque patterns located in the fan-out area and in the display area, a partially transparent pattern located in the fan-out area and outside the opaque patterns, and a transparent pattern located in the display area and outside the opaque pattern; and
- after development, forming a photoresist removal portion corresponding to a region of the display area other than the second photoresist reserved portion, a photoresist partially reserved portion corresponding to a region of the fan-out area other than the first photoresist reserved portion, a first photoresist reserved portion corresponding to the first photoresist reserved portion in the fan-out area, and a second photoresist reserved portion corresponding to the second photoresist reserved portion in the display area;
- wherein the etching off the metal portion of the metal layer corresponding to the photoresist removal portion comprises:
- etching off the metal layer corresponding to the photoresist removal portion; and
- ashing the photoresist partially reserved portion, and etching off the metal layer corresponding to the photoresist partially reserved portion.

* * * * *